(12) United States Patent
Chen et al.

(10) Patent No.: US 7,348,672 B2
(45) Date of Patent: Mar. 25, 2008

(54) INTERCONNECTS WITH IMPROVED RELIABILITY

(75) Inventors: Hsien-Wei Chen, Tainan (TW); Hsueh-Chung Chen, Taipei (TW); Shin-Puu Jeng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 74 days.

(21) Appl. No.: 11/175,329

(22) Filed: Jul. 7, 2005

(65) Prior Publication Data
US 2007/0007653 A1    Jan. 11, 2007

(51) Int. Cl.
*H01L 23/48* (2006.01)
*H01L 23/52* (2006.01)
*H01L 29/40* (2006.01)

(52) U.S. Cl. ............... 257/758; 257/762; 257/774; 257/E23.145

(58) Field of Classification Search ........ 257/758–760, 257/762, 774–775
See application file for complete search history.

(56) References Cited

U.S. PATENT DOCUMENTS

| | | | |
|---|---|---|---|
| 4,801,559 A * | 1/1989 | Imaoka ................. | 438/629 |
| 6,107,687 A | 8/2000 | Fukada et al. | |
| 6,208,008 B1 | 3/2001 | Arndt et al. | |
| 6,368,953 B1 * | 4/2002 | Petrarca et al. ........... | 438/625 |
| 6,630,402 B2 | 10/2003 | Hshieh et al. | |
| 6,917,108 B2 * | 7/2005 | Fitzsimmons et al. ...... | 257/751 |
| 2002/0092763 A1 | 7/2002 | Denning et al. | |
| 2003/0027092 A1 | 2/2003 | Wolgamuth et al. | |
| 2003/0114000 A1 * | 6/2003 | Noguchi .................. | 438/687 |
| 2004/0187304 A1 | 9/2004 | Chen et al. | |
| 2004/0214425 A1 | 10/2004 | Lin et al. | |

* cited by examiner

*Primary Examiner*—Hoai v Pham
(74) *Attorney, Agent, or Firm*—Birch, Stewart, Kolasch & Birch, LLP

(57) ABSTRACT

An interconnect architecture with improved reliability. An interconnect with rounded top corners is inlaid in a dielectric layer. A filler borders the interconnect along the corners of the interconnect.

19 Claims, 4 Drawing Sheets

INTERCONNECTS WITH IMPROVED RELIABILITY

BACKGROUND

The present invention relates in general to semiconductor manufacturing. More particularly, it relates to an interconnect architecture with improved reliability and a method for fabricating the same, most suitably for the 65 nm technology node and beyond.

Integrated circuits (ICs) typically include metal wiring connecting different regions of the circuit. The metal wiring is insulated by a dielectric material in order to prevent capacitance coupling, leakage, or cross-talk between the electrical pathways. Metal wiring forming the interlevel connection are commonly referred to as interconnects and are formed by depositing a metal in an opening such as a via, a hole, or a trench. The metallic interconnect is typically fabricated using damascene or dual damascene technique.

With continuing device scaling beyond the 90 nm node, wiring interconnection becomes increasingly important in limiting chip density and performance. Fundamental changes in interconnect materials are needed with Cu replacing Al and low permittivity dielectrics replacing silicon dioxide. The integration of these two advanced materials has resulted in significant reduction in signal delay, cross-talk and power dissipation, enabling the semiconductor industry to continue device scaling. The fabrication of Cu/low k interconnects requires novel materials and processes, including electroplating with Cu, dual damascene structures, chemical-mechanical polishing (CMP), ultra-thin barriers and passivation layers. The novel materials and processes have given rise to distinct structure and defect characteristics raising yield and reliability concerns for Cu/low k interconnects. As the technology continues to advance, the CMP of Cu interconnects beyond the 65 nm node has brought new processing and reliability issues.

The invention is generally directed to a novel interconnect architecture for improvement of reliability.

SUMMARY

According to one aspect of the invention, a semiconductor device with improved interconnects is provided.

An exemplary semiconductor device comprises a dielectric layer; an interconnect with rounded top corners inlaid in the dielectric layer; and a filler bordering the interconnect along the corners.

Another exemplary semiconductor device comprises a dielectric layer having a trench therein; an interconnect with rounded top corners inlaid in the trench with a diffusion barrier interposed therebetween; and a pair of fillers disposed in recesses between the rounded top corners and sidewalls of the trench such that the fillers bracket the interconnect.

According to another aspect of the invention, a method for forming a semiconductor device with improved interconnects is provided.

An exemplary method comprises providing a dielectric layer having a trench therein; forming an interconnect with rounded top corners inlaid in the trench; and forming a filler in recesses between the rounded top corners and sidewalls of the trench.

Further scope of the applicability of the present invention will become apparent from the detailed description given hereinafter. However, it should be understood tat the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION

Figure 1:
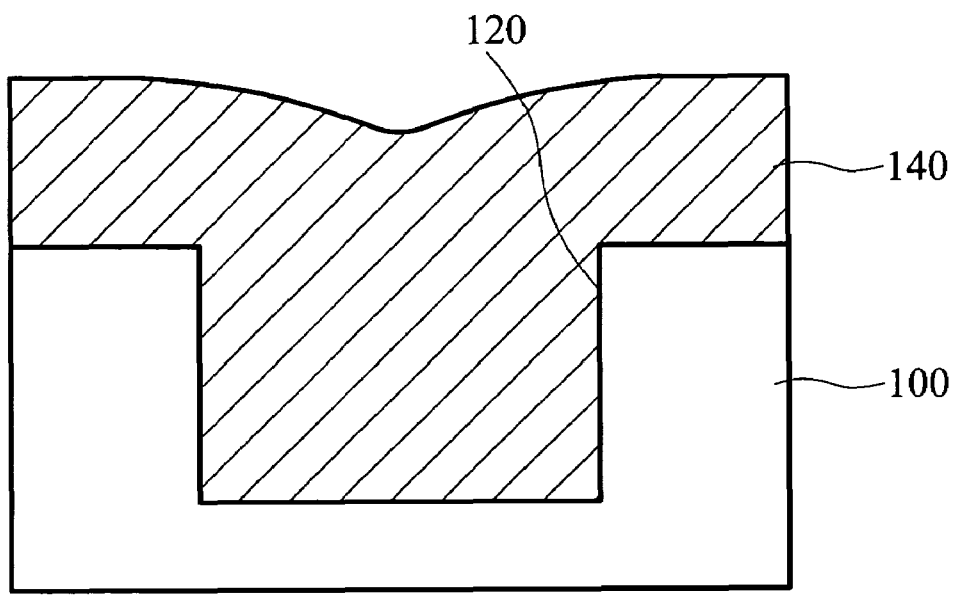
FIGS. 1 to 2 are cross-sections illustrating a method for forming copper interconnects in integrated circuits known to the inventors.
Figure 2:
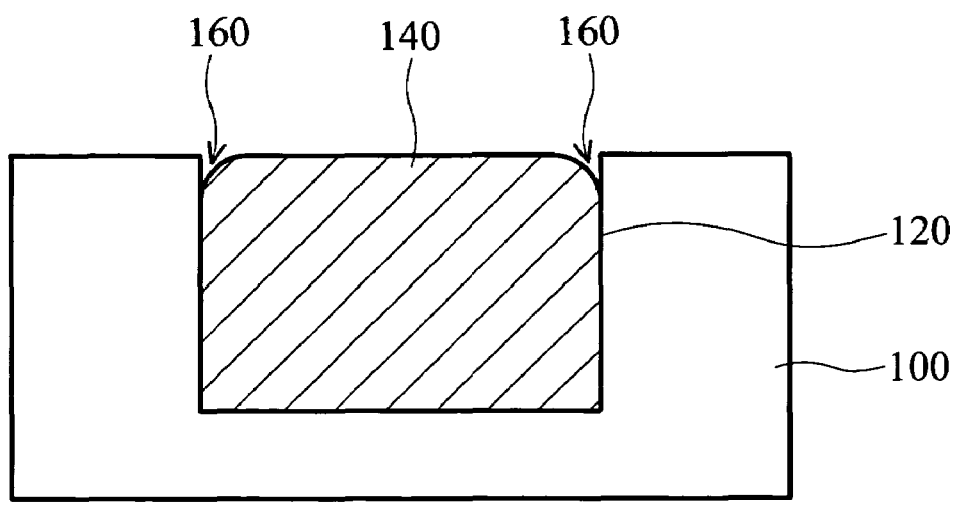

FIGS. 1 to 2 illustrate a method known to the inventors of forming copper (Cu) interconnects in integrated circuits. This is not presented as prior art for the purpose of determining the patentability of the invention, but merely illustrates a problem found by the inventors.

As shown in FIG. 1, an intermetal dielectric (IMD) layer 100 has a trench 120 formed therein. The IMD layer 100 usually comprises low k dielectric material (k<3.9) such as BD (Black Diamond® a product of Applied Materials of Santa Clara, Calif.). A copper layer 140 is deposited over the IMD layer 100, filling the trench 120. The copper layer 140 is then planarized to the upper surface of the IMD layer 100 by chemical mechanical polishing (CMP) and buffing. As opposed to traditional dishing that results in concave upper surfaces, when the interconnect shrinks to 65 nm node design rule, a new issue referred to as "Barrier Edge Enhanced Recess" (BEER) arises after the CMP. As shown in FIG. 2, metal loss has occurred at trench corners, creating recesses 160 along both sides of the interconnect. It is believed that this thickness loss of interconnect is a result of chemical-dominated erosion during CMP.

The unwanted recess causes reduced yield, unreliability and unacceptable performance. First, it depletes the resistance (Rs) uniformity of the interconnects, since the metal is removed unevenly at different areas across the processing wafer. Second, electromigration reliability is adversely affected since leakage current is easily produced by the weak interface. To deal with this newly arisen issue, the following structure and method are disclosed to provide interconnects with reduced Rs variation and improved reliability.

In the following, an illustrative embodiment of the invention will be described by referring to a dual damascene construction. It will be appreciated, however, that the invention is equally applicable to a single damascene construction.

Figure 3:
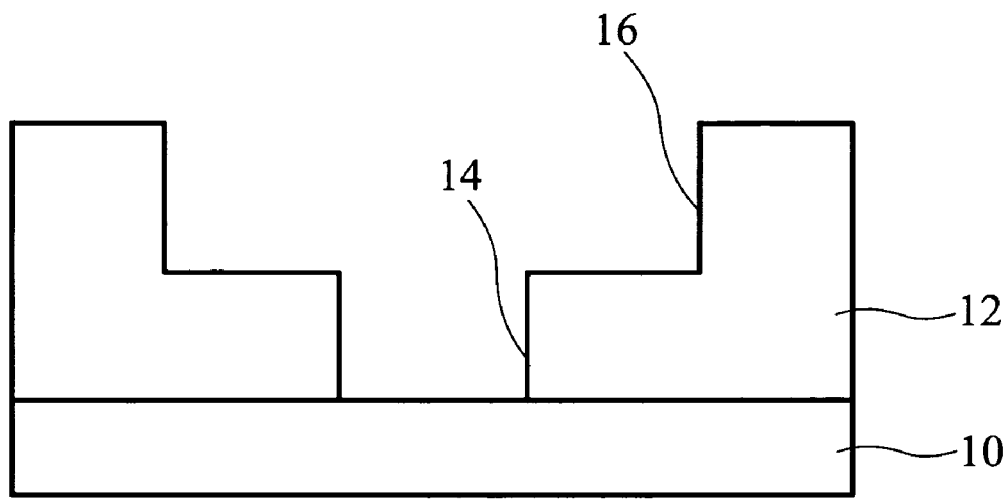
FIGS. 3 to 7 are cross-sections showing a method of forming interconnects according to an embodiment of the present invention.

Referring to FIG. 3, on a semiconductor structure 10, an IMD layer 12 is formed with a dual damascene opening including interconnect trench 16 and via opening 14. The semiconductor structure is understood to possibly include a semiconductor wafer or substrate, active and passive devices formed within the wafer, conductive layers, and dielectric layers formed over the wafer surface. The term "semiconductor structure" is meant to include devices formed within a semiconductor wafer and the layers overlying the wafer.

The IMD layer 12 may consist of one or more commonly used dielectric materials in semiconductor processing. For example, the IMD layer 12 may comprise silicon dioxide, borosilicate glass (BSG), borophosphosilicate glass (BPSG), phosphosilicate glass (PSG), and preferably comprises low-k (k<3.9) materials such as fluorine doped oxide, carbon doped oxide, hydrogen silsesquioxane (HSQ), SiLK available from Dow Chemicals, FLARE available from Allied Signal, and Black Diamond from Applied Materials, although other low-k materials may also be used. Optionally, the IMD layer 12 may comprise an intermediate etch stop layer such as SiN, SiON, or SiC.

The IMD layer 12 is then patterned using lithography and etching techniques to form a via opening 14 and an interconnect trench 16 over the via opening 14. For interconnect applications for 65 nm technology node and beyond, the interconnect trench 16 typically has a width not exceeding about 25,000 nm, and is preferably about 50-20,000 nm wide and 100-1,000 nm deep.

Figure 4:
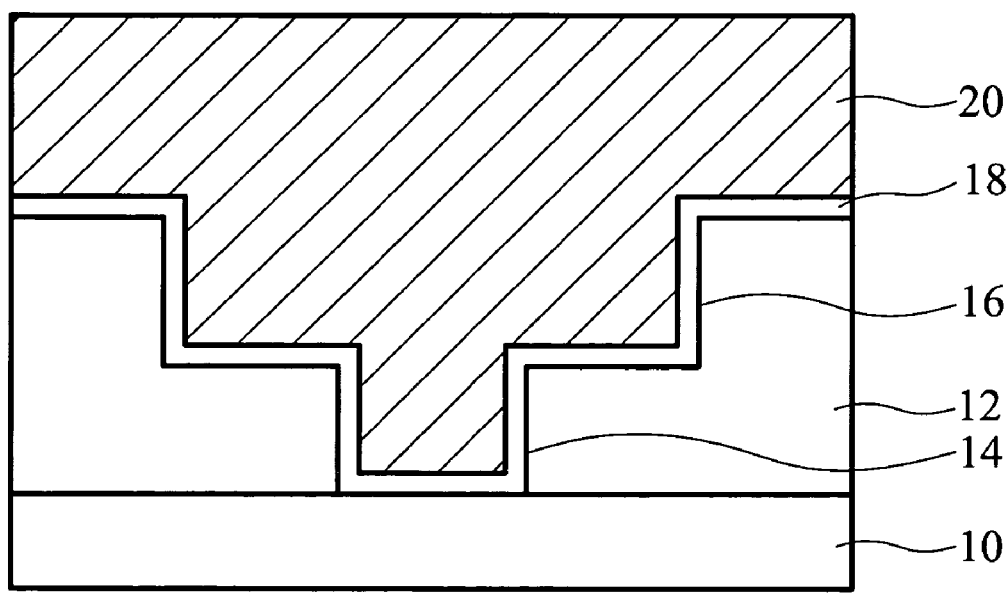

Referring to FIG. 4, a conformal diffusion barrier layer 18 can be deposited on the sidewalls and bottom of the via opening 14 and the trench 16. The diffusion barrier layer 18 can be deposited by CVD, plasma enhanced CVD, or atomic layer deposition (ALD). The diffusion barrier 18 may include Ta, TaN, Ti, TiN, TaSiN, W, or WN, or a composite layer of two or more of the aforementioned materials. Next, a conductive layer 20, that may be tungsten (W), silver (Ag), or gold (Au) and preferably copper (Cu) or copper alloys, is then deposited over the barrier layer 18, completely filling the trench 16 and via opening 14. The conductive layer 20 may be formed by electroless deposition, CVD methods, or more preferably by electrochemical deposition (ECD).

Figure 5:
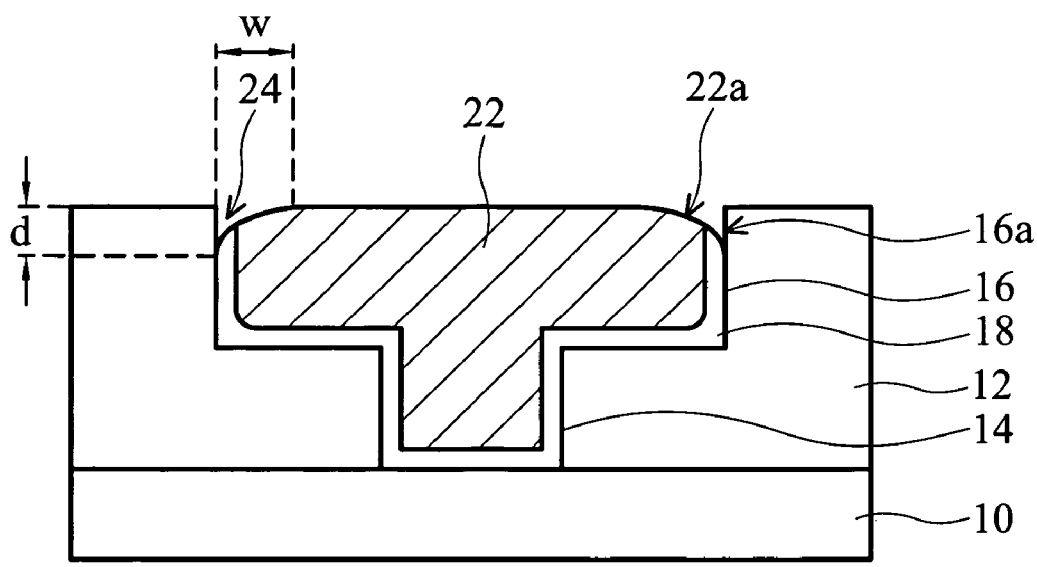

The conductive layer 20 is then chemical mechanical polished (CMP) to form the structure shown in FIG. 5. As illustrated, an interconnect 22 with rounded top corners 22a is inlaid in the IMD layer 12 and as a result of corner rounding, recesses 24 are formed between the rounded corners 22 and the sidewalls 16a of the trench 16. As mentioned, the recess 24 may be caused by chemical erosion during the CMP and will deteriorate the interconnect reliability. Typically, the recesses 24 have a width (w) of about 100-500 Å and an depth (d) of about 100-500 Å.

Figure 6:
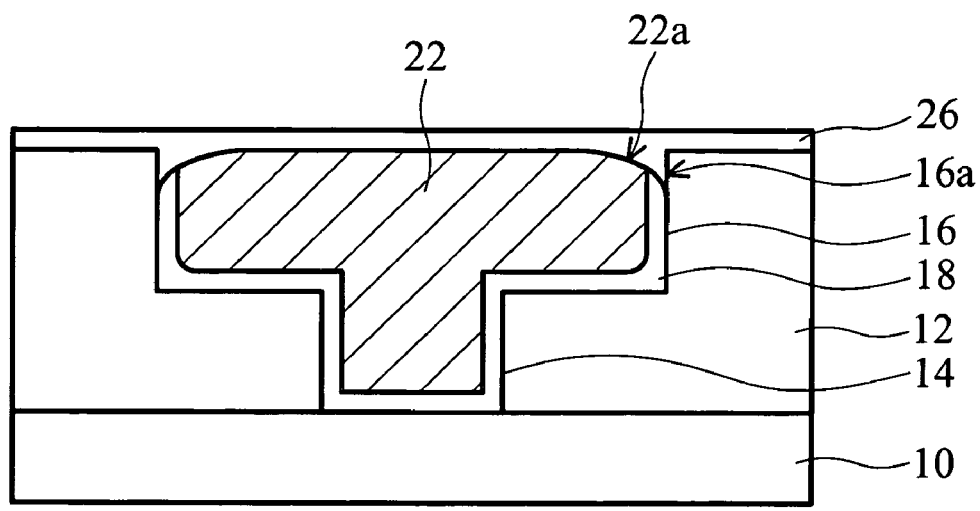
Figure 7:
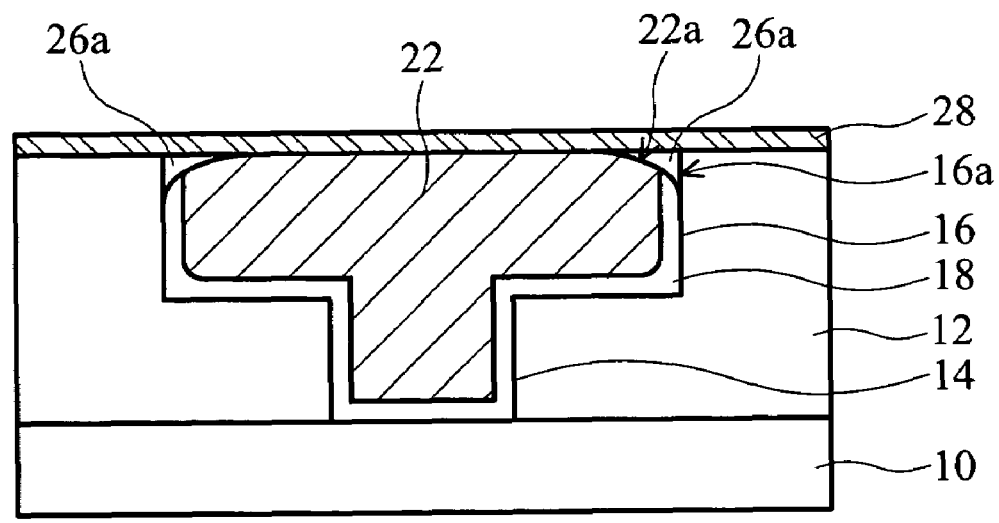

Referring now to FIG. 6, an important feature of the invention is illustrated. A filler layer 26 having a thickness of about 500-700 Å is deposited on the IMD layer 12 and the interconnect 22, filling the recesses 24. The filler layer 26 is then polished by a buffing step to remove the filler beyond the recesses 24 and expose the top surfaces of the interconnect 22 and the IMD layer 12. Referring to FIG. 7, the remaining filler 26a is substantially coplanar with the IMD layer 12 and the interconnect 22. Next, an etch stop or cap layer 28 such as silicon nitride, silicon oxynitride, or silicon carbide may be deposited on the planarized structure.

Accordingly, the interconnect architecture of invention includes an interconnect 22 with rounded top corners 22a inlaid in the trench 16 with a diffusion barrier 18 interposed therebetween, and a pair of fillers 26a disposed in the recesses between the rounded top corners 22a and sidewalls 16a of the trench 16. As shown in FIG. 7, the fillers 26a bracket the interconnect 22 when viewed in transverse cross-section, and each of the fillers 26a has a substantially triangular cross section with at least one curved side bordering the rounded corner 22a of the interconnect 22.

According to the invention, the fillers 26a are preferably conductive fillers, more preferably materials resisting diffusion of the interconnect 22, and most preferably the same material as the diffusion barrier layer 18. Suitable materials for the fillers 26a include but are not limited to Ta, TaN, Ti, TiN, TaSiN, W, WN, CoWP, or combinations thereof. Although the fillers 26a are shown as a distinct layer on the diffusion barrier layer 18 for illustrative purposes, when formed of the same material, they may be not distinguishable as such. In such a case, the fillers 26a can be regarded as top portions of the diffusion barrier 18 which bracket the rounded corner 22a of the interconnect 22. Note that the fillers 26a and the diffusion barrier 18 can be different materials although the same material is particularly preferred.

Figure 8:
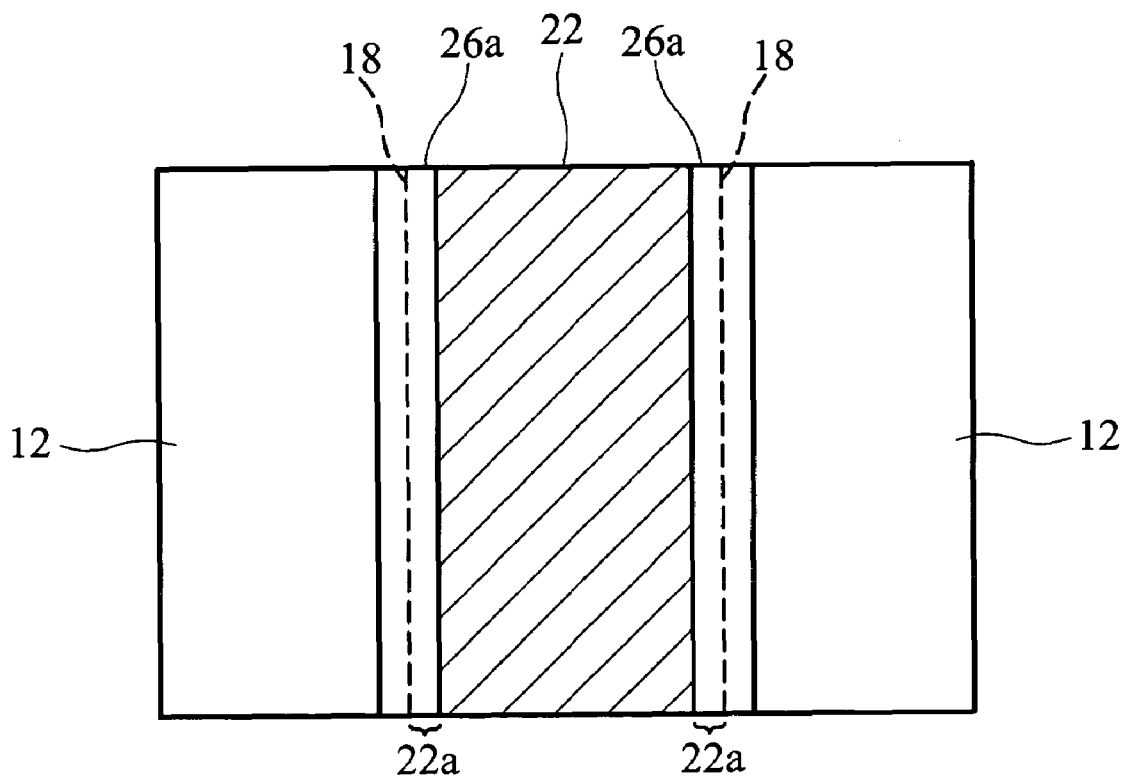
FIG. 8 is a top view showing an interconnect structure according to an embodiment of the invention.

FIG. 8 is a top view of the interconnect structure according to a preferred embodiment the invention. The interconnect 22 with rounded top corners 22a is inlaid in the IMD layer 12, and a pair of fillers 26a border both sides of the interconnect 22 along the rounded corners 22. The diffusion barrier layer 18 underlying the filler 26a is indicated by broken line 18.

The interconnect structure of the invention provides more reliable and uniform resistance over the process wafer. According to experiments, large Rs variation can be decreased by conductive fillers without substantially increasing the resistance value. Specifically, the distribution of resistance values over measured areas of the wafer showed a greatly reduced distribution tail as indicated in a cumulative distribution graph to represent a larger number of measurements over various areas of a process wafer. In addition, the fillers 26a may prevent metal ions of interconnect 22 from surface diffusion and enable the interconnect 22 to adhere to the IMD layer 12 and/or the etch stop layer 28, thus improving reliability.

While the invention has been described by way of example and in terms of preferred embodiment, it is to be understood that the invention is not limited thereto. To the contrary, it is intended to cover various modifications and similar arrangements (as would be apparent to those skilled in the art) Therefore, the scope of the appended claims should be accorded the broadest interpretation so as to encompass all such modifications and similar arrangements.

What is claimed is:

1. A semiconductor device, comprising:
a dielectric layer;
a copper interconnect with outwardly rounded top corners inlaid in the dielectric layer; and
a filler bordering the interconnect along the corners; wherein the filler caps the top corners and is substantially coplanar with the interconnect.

2. The semiconductor device of claim 1, wherein the filler is a conductive filler.

3. The semiconductor device of claim 1, wherein the filler is formed of a material resisting diffusion of the interconnect.

4. The semiconductor device of claim 1, wherein the filler comprises Ta, TaN, Ti, TiN, TaSiN, W, WN, CoWP, or combinations thereof.

5. The semiconductor device of claim 1, wherein the filler has a substantially triangular cross section with one concave side facing the interconnect.

6. The semiconductor device of claim 1, further comprising an etch stop layer directly contacting the interconnect, the filler, and the dielectric layer.

7. A semiconductor device, comprising:
a dielectric layer having a trench therein;
a copper interconnect with outwardly rounded top corners inlaid in the trench with a diffusion baiter interposed therebetween; and
a pair of fillers disposed in recesses between the rounded top corners and sidewalls of the trench such that the fillers bracket the interconnect; wherein the fillers are conductive fillers.

8. The semiconductor device of claim 7, wherein the dielectric layer comprises a low-k dielectric material.

9. The semiconductor device of claim 7, wherein the fillers are substantially coplanar with the interconnect and the dielectric layer.

10. The semiconductor device of claim 7, wherein the fillers and the diffusion barrier are the same material.

11. The semiconductor device of claim 7, wherein the fillers and the diffusion barrier are different materials.

12. The semiconductor device of claim 7, wherein the fillers comprise Ta, TaN, Ti, TiN, TaSIN, W, WN, CoWP, or combinations thereof.

13. The semiconductor device of claim 7, wherein the fillers have a substantially triangular cross section with one concave side facing the interconnect.

14. The semiconductor device of claim 7, further comprising an etch stop layer directly contacting the interconnect, the filler, and the dielectric layer.

15. A semiconductor device, comprising:
a dielectric layer having a trench therein;
a copper interconnect with outwardly rounded top corners inlaid in the trench; and
a diffusion barrier interposed between the dielectric layer and the interconnect, with top portions bracketing the rounded top corners of the copper interconnect; wherein the top portions have a substantially triangular cross section with one concave side facing the interconnect.

16. The semiconductor device of claim 15, wherein the dielectric layer comprises a low-k dielectric material.

17. The semiconductor device of claim 15, wherein the dielectric layer comprises carbon-doped oxide.

18. The semiconductor device of claim 15, wherein the diffusion barrier comprises Ta, TaN, Ti, TiN, TaSiN, W, WN, CoWP, or combinations thereof.

19. The semiconductor device of claim 15, further comprising an etch stop layer directly contacting the interconnect, the filler, and the dielectric layer.

* * * * *